(12) United States Patent
Chiba et al.

(10) Patent No.: US 7,545,083 B2
(45) Date of Patent: Jun. 9, 2009

(54) PIEZOELECTRIC DEVICE AND METHOD FOR MANUFACTURING THE SAME

(75) Inventors: Seiichi Chiba, Minowa-machi (JP); Yugo Koyama, Ina (JP)

(73) Assignee: Epson Toyocom Corporation, Tokyo (JP)

( * ) Notice: Subject to any disclaimer, the term of this patent is extended or adjusted under 35 U.S.C. 154(b) by 0 days.

(21) Appl. No.: 11/902,037

(22) Filed: Sep. 18, 2007

(65) Prior Publication Data
US 2008/0067892 A1    Mar. 20, 2008

(30) Foreign Application Priority Data
Sep. 19, 2006  (JP)  ............................. 2006-253004
Jul. 17, 2007  (JP)  ............................. 2007-185557

(51) Int. Cl.
*H01L 41/08* (2006.01)
(52) U.S. Cl. ..................................................... 310/344
(58) Field of Classification Search ................ 310/348, 310/344, 346, 313 R, 340; *H01L 41/08, H01L 41/053*
See application file for complete search history.

(56) References Cited

U.S. PATENT DOCUMENTS 5,471,722 A * 12/1995 Yatsuda ....................... 310/344
5,821,665 A * 10/1998 Onishi et al. ............. 310/313 R
6,734,605 B2 * 5/2004 Kinoshita ................... 310/344

FOREIGN PATENT DOCUMENTS

JP   A-2002-185254   6/2002
JP   A-2003-347846   12/2003
JP   A-2004-180012   6/2004

* cited by examiner

*Primary Examiner*—Quyen P Leung
*Assistant Examiner*—Karen B Addison
(74) *Attorney, Agent, or Firm*—Oliff & Berridge, PLC

(57) ABSTRACT

A piezoelectric device includes a piezoelectric resonator including a piezoelectric resonator element, a package for accommodating the piezoelectric resonator in a cavity thereinside, a lid for airtightly sealing the cavity inside the package, a package base included in the package, and an external terminal formed on a bottom surface of the package base; a circuit element stacked together with the piezoelectric resonator to be electrically connected thereto; a wiring substrate having the circuit element mounted on a first surface thereof and a mounting external terminal provided on a second surface thereof, a connecting member arranged in a periphery of the circuit element mounted on the first surface of the wiring substrate to electrically and mechanically connect the wiring substrate to the external terminal of the piezoelectric resonator; and a molded portion made of a molding member that is formed from the first surface of the wiring substrate up to at least a position higher than an upper end surface of the package base of the piezoelectric resonator, the molded portion covering the first surface of the wiring substrate, the package base of the piezoelectric resonator, the external terminal formed on the bottom surface of the package base, the circuit element, and the connecting member, whereas at least a part of a marking region on the lid being exposed from the molded portion.

4 Claims, 9 Drawing Sheets

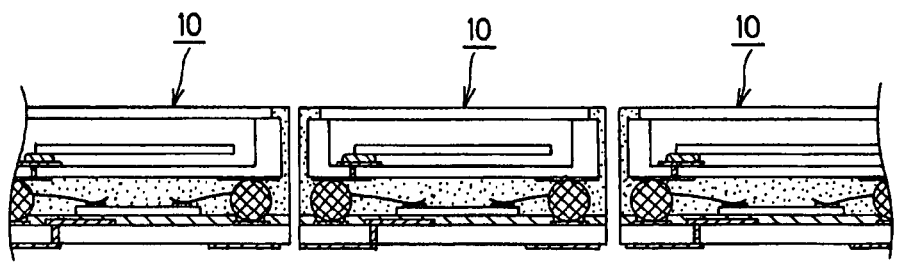
FIG.10
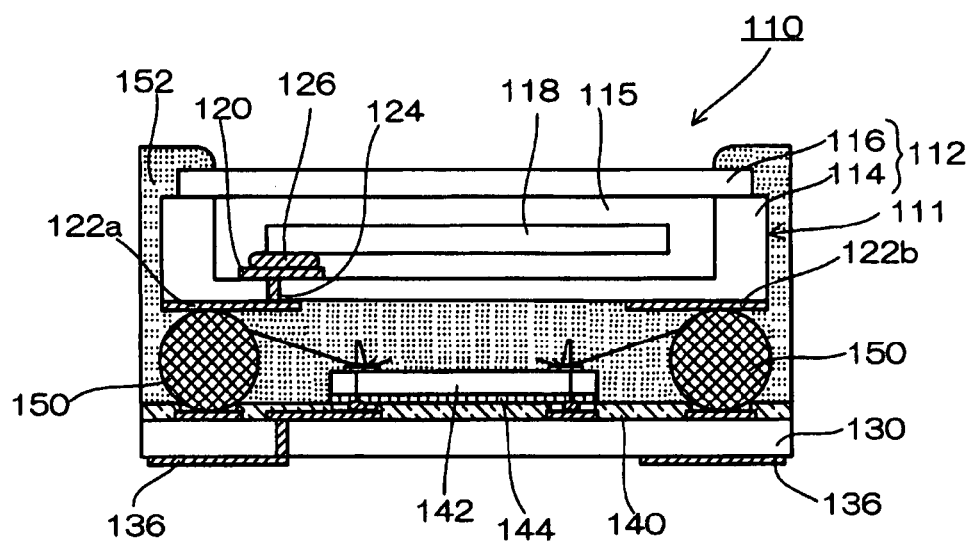
FIG.11A
FIG.11B

PIEZOELECTRIC DEVICE AND METHOD FOR MANUFACTURING THE SAME

BACKGROUND

1. Technical Field

The present invention relates to a piezoelectric device and a method for manufacturing the same. Particularly, the invention relates to a piezoelectric device including a piezoelectric resonator and a circuit element connected thereto, which are stacked in their thickness direction, and a method for manufacturing the piezoelectric device.

2. Related Art

There is known a structure of a piezoelectric oscillator having an oscillation circuit (e.g. an integrated circuit such as an IC), as shown in FIGS. 17 and 18. Specifically, a piezoelectric oscillator 1 shown in FIG. 17 includes a package 2 for accommodating a piezoelectric resonator element 4. The package 2 has stepped inner surfaces to arrange the piezoelectric resonator element 4 on an upper side and an IC 3 on a lower side in the single package 2. Meanwhile, a piezoelectric oscillator 1a shown in FIG. 18 includes a package 2a with an H-shaped structure for accommodating the piezoelectric resonator element 4, where the piezoelectric resonator element 4 and the IC 3, respectively, are accommodated in different cavities. The piezoelectric oscillators structured as above have superiority for further miniaturization and their structures can satisfy a recent demand for smaller electronic devices.

Meanwhile, in each of the piezoelectric oscillators 1 and 1a having the above structure, both of the IC 3 and the piezoelectric resonator element 4 are mounted in the single package 2 or 2a. Even if only one of the piezoelectric resonator element 4 and the IC 3 is found to be defective in its manufacturing process, the entire piezoelectric oscillator including both elements needs to be disposed.

Given that situation, there has been proposed a piezoelectric oscillator, as in JP-A-2004-180012. FIG. 19 schematically shows a structure of a piezoelectric oscillator 1b disclosed in the foregoing literature. The structure thereof allows miniaturization and elimination of waste associated with handling of defects in its manufacturing process. The oscillator 1b basically includes the IC 3, a wiring substrate 6 for mounting the IC 3 thereon, a connecting member 7, and a piezoelectric resonator 5 mounted on the wiring substrate 6 by the connecting member 7. On a first surface of the wiring substrate 6 are disposed a terminal (bonding pad) 6b used for mounting the IC 3 and a terminal (connecting pad) 6a used for arranging the connecting member 7. On a second surface thereof is disposed a mounting terminal 6c used for mounting the piezoelectric oscillator 1b on a substrate of another device or the like. Additionally, the IC 3 mounted on the wiring substrate 6 is subjected to potting using a molding member (insulating resin) 8 to protect the IC 3 and a metallic wire 9 for mounting the IC 3 from moisture, contamination, shock and other problems.

JP-A-2004-180012 is an example of related art.

The piezoelectric oscillator disclosed in the above example thereof can be miniaturized, as well as the piezoelectric resonator and the IC can be individually disposed if any defect occurs therein.

However, in the above piezoelectric oscillator, it is only the molding member that can protect the IC. Thus, there is a concern that moisture (water) entering from a thin portion of the molding member or a boundary portion between the molding member and the components covered by the molding member can badly affect the IC or any other metal member thereinside. Moisture adhered on an electrode or the like inside the molding member changes electrical resistance, which can cause a problem such as a deviation of an oscillation frequency.

On a surface of a lid of the piezoelectric resonator, there are carved indications (markings) representing specifications thereof, such as an oscillation frequency and a manufacturing lot number. The markings are important for visual confirmation of a product identity. However, when the piezoelectric oscillator is entirely covered by the molding member as above, the lid surface is also inevitably covered thereby. As a result, in the piezoelectric oscillator as a finished product, it is impossible to confirm the markings provided on the lid of the piezoelectric resonator.

SUMMARY

Accordingly, an advantage of the present invention is to provide a piezoelectric device capable of providing a sufficient protective effect by a molding member and allowing confirmation of markings formed on a lid of a piezoelectric resonator. Another advantage of the invention is to provide a method for manufacturing the piezoelectric device.

The present invention has been proposed to solve at least one of the problems described above and can be achieved by various aspects and forms such as those given below.

A piezoelectric device according to a first aspect of the invention includes a piezoelectric resonator including a piezoelectric resonator element, a package for accommodating the piezoelectric resonator in a cavity thereinside, a lid for airtightly sealing the cavity inside the package, a package base included in the package, and an external terminal formed on a bottom surface of the package base; a circuit element stacked together with the piezoelectric resonator to be electrically connected thereto; a wiring substrate having the circuit element mounted on a first surface thereof and a mounting external terminal provided on a second surface thereof; a connecting member arranged in a periphery of the circuit element mounted on the first surface of the wiring substrate to electrically and mechanically connect the wiring substrate to the external terminal of the piezoelectric resonator; and a molded portion made of a molding member that is formed from the first surface of the wiring substrate up to at least a position higher than an upper end surface of the package base of the piezoelectric resonator, the molded portion covering the first surface of the wiring substrate, the package base of the piezoelectric resonator, the external terminal formed on the bottom surface of the package base, the circuit element, and the connecting member, whereas at least a part of a marking region on the lid being exposed from the molded portion.

In the above piezoelectric device, the molding member covers the first surface of the wiring substrate, the package base of the piezoelectric resonator, the external terminal formed on the package base, the circuit element and the connecting member. The structure can increase a resistance against moisture or the like and also can prevent a short circuit due to a foreign substance between a metallic portion of the piezoelectric device and another element. Meanwhile, at least a part of the marking region on the lid of the piezoelectric resonator is exposed outside the molded portion, so that markings formed on the lid can be confirmed.

Preferably, in the above piezoelectric device, the connecting member includes two or more members having different melting points, the member with a higher melting point being a core whose outer periphery is covered by the member with a lower melting point and at least the latter member being a conductive member.

In the connecting member having the above structure, the core member with the higher melting point can determine a height of the piezoelectric resonator as an object supported by the core member, whereas the conductive member with the lower melting point can establish an electrical conduction between the piezoelectric resonator and the wiring substrate.

In the piezoelectric device according to the first aspect, preferably, the circuit element is electrically connected to a mounting terminal arranged on the first surface of the wiring substrate by a metallic wire.

The circuit element and the wiring substrate are connected to each other by wire bonding using the metallic wire. Thus, a connection status between the components can be easily checked, thereby improving connection reliability therebetween. As a form for mounting the circuit element such as an IC, a flip chip bonding technology can be used, in which an active surface of the circuit element is arranged opposed to the substrate. In this case, however, it is impossible to check an actual bonding status, a condition of the active surface of the IC and the like.

In the piezoelectric device according to the first aspect, preferably, side surfaces of the molding member, of the package base and of the wiring substrate are positioned flush with one another to form a side surface of the piezoelectric device.

In the above structure, a plane size of the piezoelectric device, namely, a die size thereof can be reduced, while covering the external terminal of the piezoelectric resonator, the circuit element, and the metallic wire connecting the circuit element to the wiring substrate by the molding member.

According to a second aspect of the invention, a method for manufacturing a piezoelectric device includes arranging a connecting member on a first surface of a wiring substrate, mounting a circuit element on the first surface thereof, mounting a piezoelectric resonator on the wiring substrate by the connecting member, covering the circuit element and the piezoelectric resonator mounted on the first surface thereof by a molding member and removing the molding member adhered on a surface of a lid of the piezoelectric resonator.

After covering the piezoelectric resonator and the circuit element by the molding member, the molding member adhered on the lid surface is removed. In this manner, the lid surface can be exposed outside, while increasing the area of a region sealed by the molding member. Thereby, a resistance against water such as moisture can be improved, whereas the markings can be visually confirmed. In addition, since the molding member adhered on the lid is removed before the hardening of the molding member, it can be easily removed from the lid surface.

In the above method for manufacturing a piezoelectric device, preferably, the molding member is an insulating resin, the molding member adhered on the lid surface being removed before the member hardens.

Since the molding member adhered on the lid is removed before it hardens, it can be easily removed from the lid surface.

Additionally, in the above method for manufacturing a piezoelectric device, preferably, the wiring substrate is a sheet-shaped substrate arranged in a frame and has the circuit element including a plurality of circuit elements and the piezoelectric resonator including a plurality of piezoelectric resonators arranged thereon. In the method, the covering by the molding member is performed by pouring the molding member into the frame. Additionally, the method further includes dicing the sheet-shaped substrate and the molding member to produce individual devices after hardening of the molding member.

The above method allows manufacturing of a plurality of piezoelectric devices at one time without using an expensive metallic die. Therefore, as compared to manufacturing of a piezoelectric oscillator that performs molding using a metallic die, such as transfer molding, the above method can significantly reduce a manufacturing cost of the device.

Furthermore, in the above method for manufacturing a piezoelectric device, preferably, at the dicing step, an outer edge of a package base included in a package of the piezoelectric resonator is cut together with the sheet-shaped substrate and the molding member.

A dicing width depends on a blade width of a dicer. Thus, when arranging the circuit element and the piezoelectric resonator on the sheet substrate, cutting in the above manner allows reduction of an arrangement distance between adjacent devices. Accordingly, many more circuit elements and piezoelectric resonators can be arranged on a single sheet substrate, thereby resulting in improvement of productivity. Moreover, since dicing is performed by cutting together the outer edge of the package base of the piezoelectric resonator, the plane size of the piezoelectric device, namely, the die size thereof can be made smaller than that of the piezoelectric resonator as a component member, while keeping the inside of the piezoelectric resonator airtightly.

Additionally, in the above method for manufacturing a piezoelectric device, preferably, the removal of the molding member adhered on the lid surface is accomplished by wiping off.

Wiping off the molding member as mentioned above best ensures the removal thereof.

BRIEF DESCRIPTION OF THE DRAWINGS

The invention will be described with reference to the accompanying drawings, wherein like numbers reference like elements.

FIG. 10 shows a ninth step of manufacturing the piezoelectric oscillator.

FIGS. 11A and 11B each shows a structure of a piezoelectric oscillator according to a second embodiment of the invention.

DESCRIPTION OF EXEMPLARY EMBODIMENTS

Figure 1A:
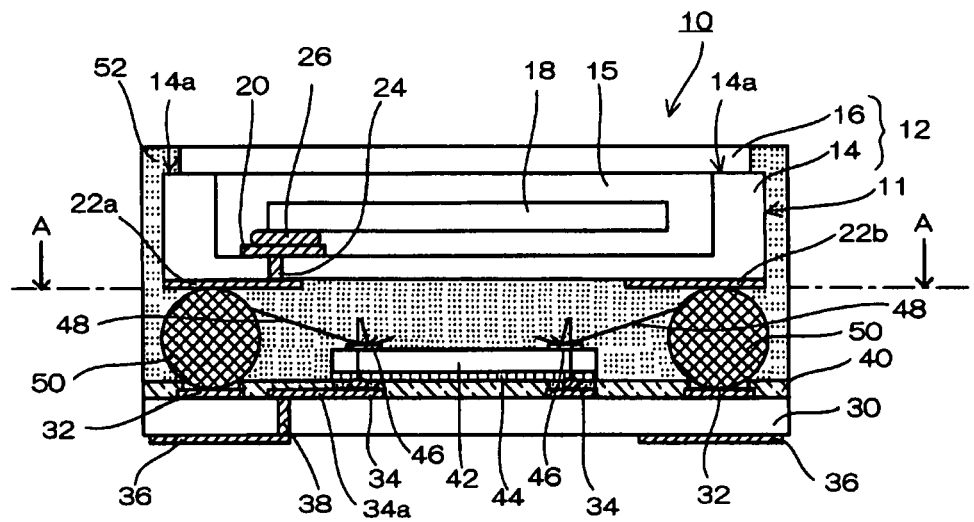
FIGS. 1A to 1C each show a structure of a piezoelectric oscillator according to a first embodiment of the invention.
Figure 1B:
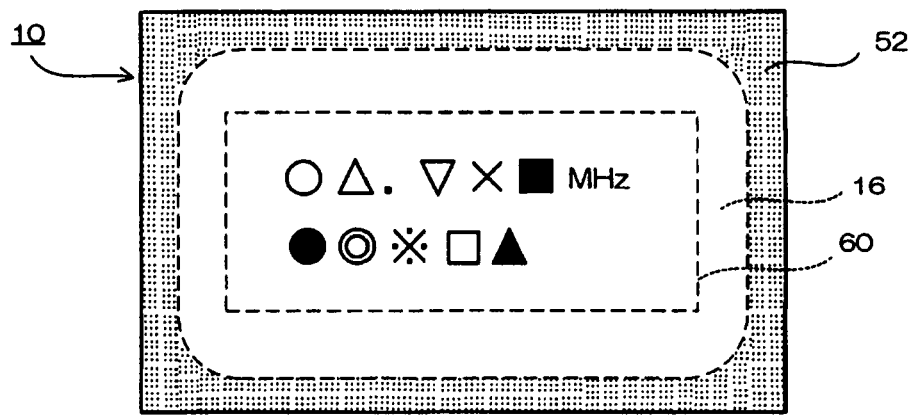
Figure 1C:
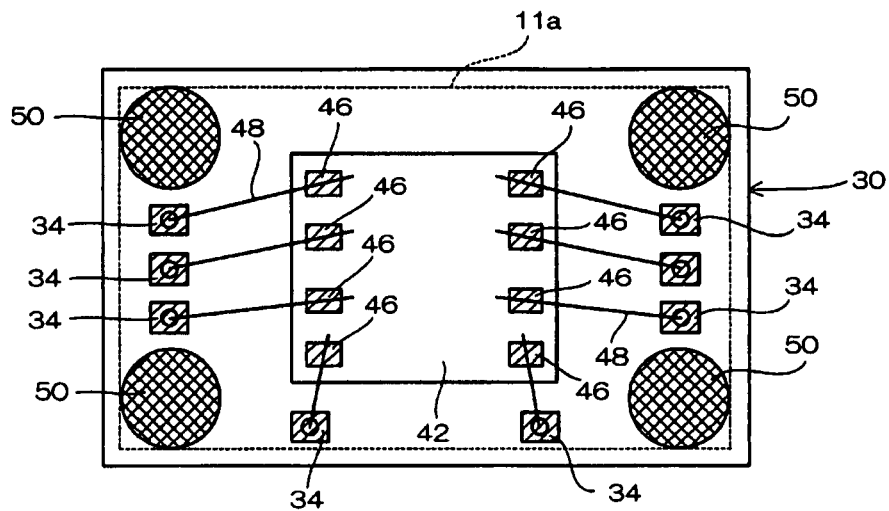

Hereinafter, exemplary embodiments of the invention will be described in detail by referring to the accompanying drawings. The following embodiments will each exemplify a piezoelectric oscillator as a piezoelectric device according to each embodiment First, a description will be given of a piezoelectric device according to a first embodiment of the invention by referring to FIGS. 1A to 1C. FIG. 1A schematically shows a side sectional view of the piezoelectric oscillator, FIG. 1B shows a plan view thereof, and FIG. 1C shows a sectional view as viewed from arrows A-A of FIG. 1A.

Basically, a piezoelectric oscillator 10 according to the first embodiment includes a piezoelectric resonator 11, an integrated circuit (IC) 42 as a circuit element, and a wiring substrate 30 having the IC 42 mounted thereon. The piezoelectric resonator 11, the IC 42, and the wiring substrate 30 are arranged so as to be stacked in their thickness direction.

The piezoelectric resonator 11 basically includes a piezoelectric resonator element 18 as a resonating element and a package 12 for accommodating the piezoelectric resonator element 18. Examples of a material of the piezoelectric resonator element 18 may include various kinds of piezoelectric substances such as crystal, lithium tantalate and lithium niobate. From a viewpoint of temperature characteristics and the like, crystal may be regarded as being excellent for the resonator element. Additionally, as a practical concrete example of the piezoelectric resonator element 18 made of crystal, there may be mentioned an. AT-cut piezoelectric resonator element, a BT-cut piezoelectric resonator element, a tuning-fork-type piezoelectric resonator element, a surface acoustic wave (SAW) element and the like. Furthermore, the package 12 basically includes a package base 14 for having the piezoelectric resonator element 18 mounted therein and a lid 16 as a cover for sealing an upper opening portion of the package base 14.

The package base 14 is formed by laminating and burning a plurality of substrates produced by molding ceramic green sheets made of an insulating material such as aluminum oxide. When the package base 14 is formed in the above manner, manufacturing of the package base having a form shown in FIG. 1A requires at least two substrates, which are a substrate formed as a bottom plate and a substrate formed as sidewalls. In the package base 14 of the present embodiment, on a first surface of the substrate as the bottom plate is provided a terminal (mounting pad) 20 for mounting the piezoelectric resonator element 18, and on a second surface thereof, namely on a bottom surface of the package base 14 are provided mounting external terminals 22 (22a and 22b). The terminal 22a of the mounting external terminals 22 is electrically connected to the mounting pad 20 by a via hole 24.

The lid 16 is formed by using a base material, which is an alloy having a thermal expansion coefficient close to that of the package base 14, such as kovar. The lid 16 is bonded to an upper end surface 14a of the package base 14 by a wax material such as a seam ring (not shown in the drawings).

In the package base 14 having the above structure, the piezoelectric resonator element 18 is mounted by a conductive adhesive 26. The mounting process will be schematically described as follows. That is, the conductive adhesive 26 is applied on the mounting pad 20 of the package base 14. Next, the piezoelectric resonator element 18 is mounted such that an input/output electrode (not shown in the drawings) of the piezoelectric resonator element 18 is positioned above the applied conductive adhesive 26. After completion of the mounting thereof, the upper opening portion of the package base 14 is sealed by the lid 16. It is preferable to vacuum inside a cavity 15 of the package 12.

On a first surface of the wiring substrate 30 are disposed metallic patterns (including 34a) for electrically connecting the piezoelectric resonator 11 to the IC 42 and for electrically connecting the IC 42 to a mounting external terminal 36. Additionally, on a second surface (bottom surface) of the wiring substrate 30 is disposed the mounting external terminal 36 for mounting the piezoelectric oscillator 10 on a substrate (not shown) of an electronic apparatus or the like. Furthermore, on the second surface of the wiring substrate 30 may be disposed an adjustment terminal (not shown) for performing inspection of IC characteristics or rewriting of information (adjustment of characteristics) stored inside the IC if necessary.

On the first surface of the wiring substrate 30 is formed a coating film 40 made of an insulating coating material such as a resist. On the surface of the wiring substrate 30, a bonding pad 34 is disposed to be electrically connected to the IC 42 by a metallic wire and each of a plurality of connection pads 32 only is exposed for arranging a connecting member 50, whose details will be described later. The bonding pad 34 and the mounting external terminal 36 are electrically connected to each other by a via hole 38, as partially shown in the drawing. The IC 42 may serve not only as an oscillation circuit but also a circuit for compensating frequency-temperature characteristics of the resonator. The circuit element used in the present embodiment is not restricted to an IC and may be an electronic component such as a resistor or a capacitor.

In the present embodiment, the IC 42 is mounted with its active surface facing upwardly near a center of the first surface of the wiring substrate 30 described above. In order to mount the IC 42, it is preferable to use a nonconductive adhesive or an adhesive member 44 such as an adhesive sheet. In addition, the IC 42 is mounted on the wiring substrate 30 by a so-called wire bonding using a metallic wire 48, specifically, a metallic line or the like. As the wire bonding performed when manufacturing the piezoelectric oscillator 10 of the present embodiment, a construction method by a so-called reverse bonding is preferable. The method includes a first step of providing a bonding to the bonding pad 34 arranged on the wiring substrate 30 and then a second step of providing a bonding to a pad 46 arranged on the active surface of the IC 42. Through the above sequential order of the steps, bonding can be performed even when the linear distance is short between the bonding pad 34 on the wiring substrate 30 and the pad 46 on the IC 42. Additionally, in the above bonding method, it is possible to reduce the height of a loop of the metallic wire 48 formed above the pad 46 on the IC 42. In the piezoelectric oscillator 10 of the present embodiment, the bonding pad 34 arranged on the wiring substrate 30 is positioned between the connection pads 32 so as to save a distance between the pad 46 on the IC 42 and the bonding pad 34 and efficiently use a space area of the surface of the wiring substrate 30.

The piezoelectric resonator 11 is mounted, above the IC 42, on the wiring substrate 30 by the connecting member 50 arranged on each of the connection pads 32. The connecting members 50 electrically and mechanically connect the connection pads 32 arranged on the wiring substrate 30 to the mounting external terminals 22 arranged outside the package 12 of the piezoelectric resonator 11. Additionally, in order to ensure mechanical stability, connection strength and the like of the piezoelectric resonator 11, the connection pad 32 is connected to the mounting external terminal 22b, which is disconnected to the piezoelectric resonator element 18.

In this case, each connecting member 50 may be a commonly known solder ball. The connecting member 50 used in the present invention is preferably a member having a structure as follows. Specifically, a core made of a material having a high melting point is coated with a conductive material having a low melting point, so that the connecting member 50 may be comprised of two or more kinds of members having different melting points. More specifically, an outer periphery of a spherical core made of copper, a resin with a high melting point or the like is coated with solder. Using the connecting member structured as above allows determination of a height for supporting an object supported by the core, (namely, the piezoelectric resonator 11 in the present embodiment), while maintaining an electrical connection by solder coated around the core. Additionally, when the core is made of such a conductive material as copper, electrical connection can be established at the portion.

The piezoelectric oscillator 10 according to the present embodiment includes the components described above and a molded portion 52 made of a molding member, which is an insulating resin serving as a protecting member. The molded portion 52 is made of the molding member, which is formed from the surface of the wiring substrate 30 on which the IC 42 is disposed up to a position higher than the upper end surface 14a of the package base 14 of the piezoelectric resonator 11. In this manner, the molded portion 52 covers the IC 42 and the connecting member 50 disposed on the first surface of the wiring substrate 30, as well as the package base 14 and the like of the piezoelectric resonator 11. Covering by the molded portion 52 in that way allows confirmation of the markings (marking region) 60 formed on the surface of the lid 16 of the piezoelectric resonator 11, while increasing a region covered thereby. In other words, it is both possible to increase the resistance against moisture and visually confirm the markings 60. Furthermore, at a reflow step performed when the piezoelectric oscillator 10 is mounted on a mounting substrate of an electronic apparatus, the connecting member 50 melted due to heating of the oscillator does not flow outside the oscillator because it is covered by the molded portion 52. Moreover, in the piezoelectric oscillator 10 according to the present embodiment, the molded portion 52 is formed up to the same height as an upper surface of the lid 16. In other words, a region excluding the upper surface of the lid 16, the bottom surface and side surfaces of the wiring substrate 30 is resin-sealed. Accordingly, the piezoelectric oscillator 10 can be made small in height, while enjoying a protective advantage provided by the molded portion 52.

A dashed line 11a shown in FIG. 1C indicates an outline shape of the piezoelectric resonator 11. Accordingly, the piezoelectric resonator 11 is spaced inwardly by a predetermined gap from an outline of the wiring substrate 30. Within the gap is disposed the molding member, so that the entire four side surfaces of the piezoelectric resonator 11 are covered by the molding member, so that the piezoelectric resonator 11 can be more solidly fixed.

Furthermore, in the piezoelectric oscillator 10 structured as above, performance check and frequency adjustment of the piezoelectric resonator 11 are executed before the resonator is mounted on the wiring substrate 30. Thus, defects can be detected before the mounting thereof. This can eliminate a waste in which due to a defect detected after the mounting thereof, the entire piezoelectric oscillator 10 including the IC 42 ends up being disposed. Consequently, its manufacturing cost can be saved.

In the embodiment described above, the lid 16 of the package 12 included in the piezoelectric resonator 11 is made of a metal and the package base 14 is made of an insulating member such as a ceramic member. However, the members are not restricted thereto. For example, the lid 16 may be made of glass or the like and the package base 14 may be made of a metal or the like. If the package base 14 is made of such a conductive member as a metal, an insulating member needs to be interposed between the package base 14 and each of the mounting pad 20, the via hole 24, and the mounting external terminal 22a.

Figure 2:
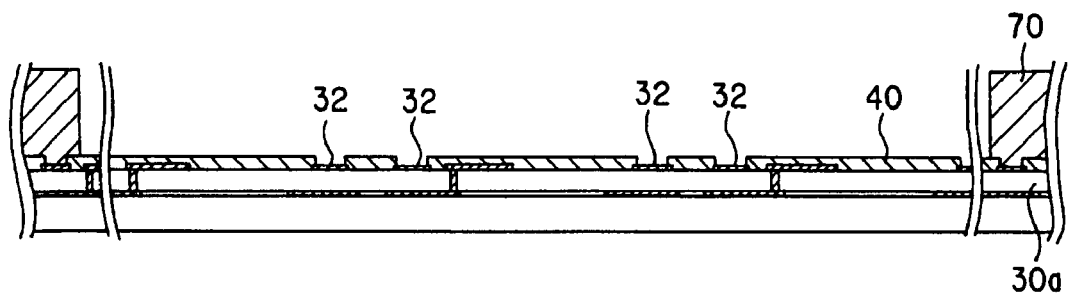
FIG. 2 shows a first step of manufacturing the piezoelectric oscillator.
Figure 3:
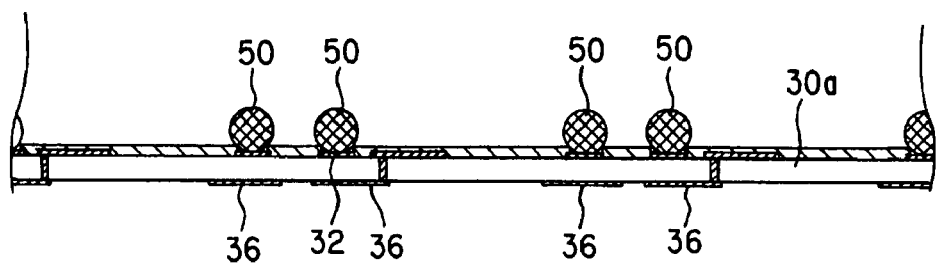
FIG. 3 shows a second step of manufacturing the piezoelectric oscillator.
Figure 4:
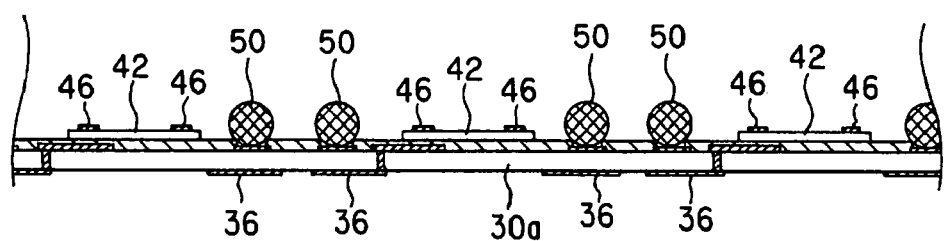
FIG. 4 shows a third step of manufacturing the piezoelectric oscillator.
Figure 5:
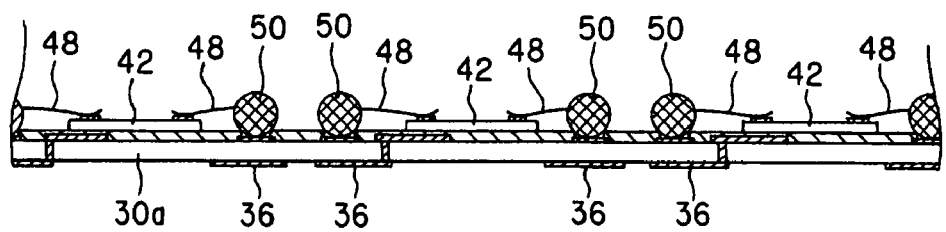
FIG. 5 shows a fourth step of manufacturing the piezoelectric oscillator.
Figure 6:
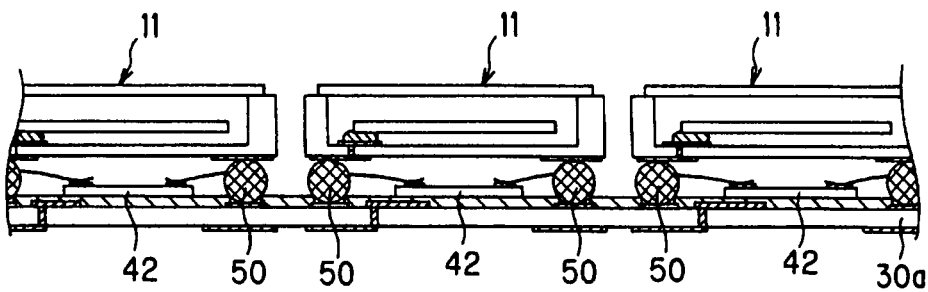
FIG. 6 shows a fifth step of manufacturing the piezoelectric oscillator.

Next will be described a method for manufacturing a piezoelectric oscillator having the foregoing structure. First, in a frame 70 used for resin molding is arranged a sheet-shaped wiring substrate (sheet-shaped substrate) 30a with its first surface facing upwardly (See FIG. 2). The sheet-shaped substrate 30a is a substrate in a state before the wiring substrate 30 of the piezoelectric oscillator 10 structured as above is diced into individual chips. Next, on each of the connection pads 32 arranged on the sheet-shaped substrate 30a is placed the connecting member 50 (See FIG. 3). After that, the IC 42 is mounted at each predetermined position of the sheet-shaped substrate 30a (See FIG. 4). After mounting the IC 42, each pad 46 on the active surface of the IC 42 is connected to the bonding pad 34 (not shown in the drawings) on the sheet-shaped substrate 30a by the metallic wire 48 (See FIG. 5). Then, the piezoelectric resonator 11 that has been manufactured in advance is mounted on the sheet-shaped substrate 30a by the connecting member 50 (See FIG. 6).

Figure 7:
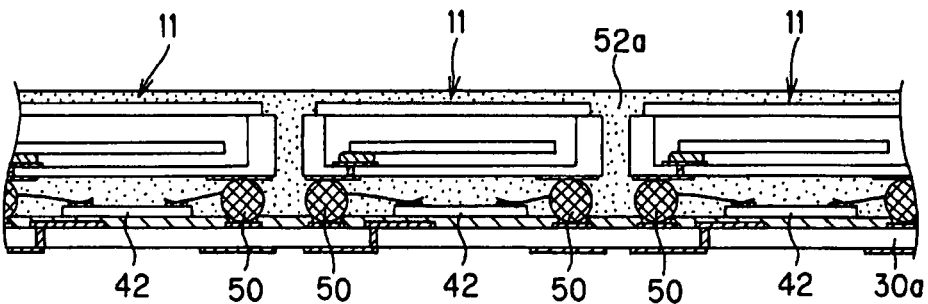
FIG. 7 shows a sixth step of manufacturing the piezoelectric oscillator.
Figure 8:
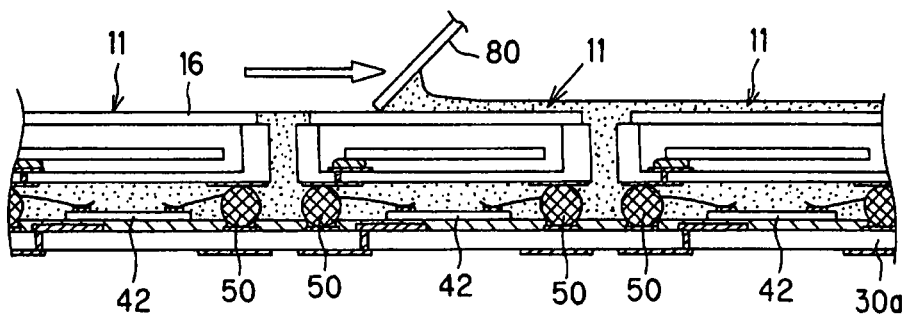
FIG. 8 shows a seventh step of manufacturing the piezoelectric oscillator.

After the mounting of the piezoelectric resonator 11, the molding member 52a made of a liquid resin is poured into the frame 70 (See FIG. 2) to cover the entire piezoelectric oscillator including the piezoelectric resonator 11 thereby (See FIG. 7). Before the poured molding member 52a hardens to become the molded portion 52, a surface of the lid 16 of the piezoelectric resonator 11 is scrapped by using a scrapper (squeegee) 80 or the like to wipe off the molding member 52a covering the surface of the lid 16 (See FIG. 8). Accordingly, through the step of wiping off the molding member 52a adhered on an exposed region before the poured member hardens, the molding member 52a adhered on the surface of the lid 16 can be removed without causing damage to the lid 16 and without any difficulty.

Figure 9:
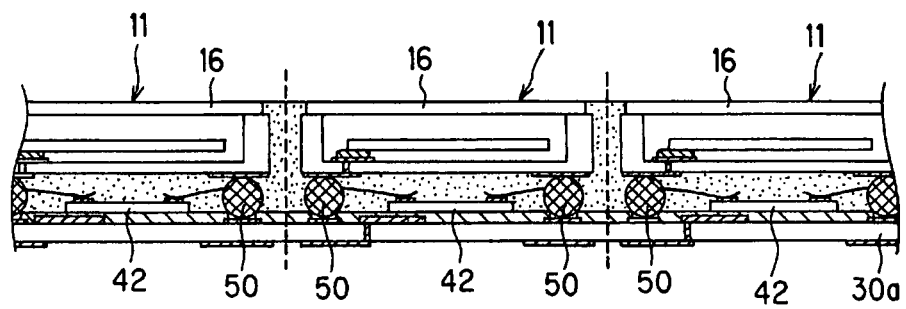
FIG. 9 shows an eighth step of manufacturing the piezoelectric oscillator.

After the molding member 52a hardens, dicing is performed at positions indicated by dashed lines shown in FIG. 9 to produce individual chips as piezoelectric oscillators. As a result, each piezoelectric oscillator 10 completed can be obtained (See FIG. 10).

In the piezoelectric oscillator 10 manufactured through the foregoing steps, the markings 60 provided on the lid 16 of the piezoelectric resonator 11 can be visually confirmed, while increasing the resin-sealed region to improve the resistance against moisture or the like.

Next, a description will be given of a piezoelectric oscillator according to a second embodiment of the invention with reference to FIGS. 11A and 11B. The piezoelectric oscillator according to the second embodiment has the approximately same structure as that of the piezoelectric oscillator 10 according to the above first embodiment. Thus, the same structural portions in FIGS. 11A and 11B have reference numerals given by adding 100 to each reference numeral in FIG. 1 and thus detailed descriptions thereof are omitted.

The piezoelectric oscillator 110 according to the second embodiment is characterized in that a molded portion 152 covering the piezoelectric oscillator 110 is formed up to a surface edge of a lid 116 of a piezoelectric resonator 111. In other words, as compared to the foregoing piezoelectric oscillator 10 according to the first embodiment, the resin-sealed region is further increased. Thus, the characteristic structure can further improve the foregoing resistance against moisture or the like. Additionally, increasing the region of the piezoelectric resonator 111 covered by the molded portion 152 can give better effect on retaining the piezoelectric resonator 111. Consequently, the strength of mechanical connections among the wiring substrate 130, the connecting member 150 and the piezoelectric resonator 111 can be increased. The other structures, mechanisms and effects are the same as those in the above piezoelectric oscillator according to the first embodiment.

A method for manufacturing the piezoelectric oscillator 110 according to the second embodiment may be provided as follows. In this case, steps up to the mounting of the piezoelectric resonator 111 on a wiring substrate 130 are the same as those in the method for manufacturing the piezoelectric oscillator 10 according to the first embodiment. Thus, only a molding step will be described below. A first technique is use of a surface tension. Specifically, a substance that repels the molding member is applied on a surface of the lid 116 (around markings 160) in advance. Then, at the step of removing the molding member adhered on the lid surface, it is only necessary to wipe off the adhered member thereon to an extent where a sheet of thin film is left. Alternatively, it is similarly effective to provide a surface tension simply by adjusting the amount of the molding member poured thereinto. In this case, no substance repelling the molding member needs to be applied on the lid surface. Furthermore, at the step of removing the molding member adhered thereon, a compressed gas (e.g. air) can also be used. Such a gas can partially blow off the molding member on the lid surface, so that the molded portion shown in the present embodiment can be formed.

Figure 12:
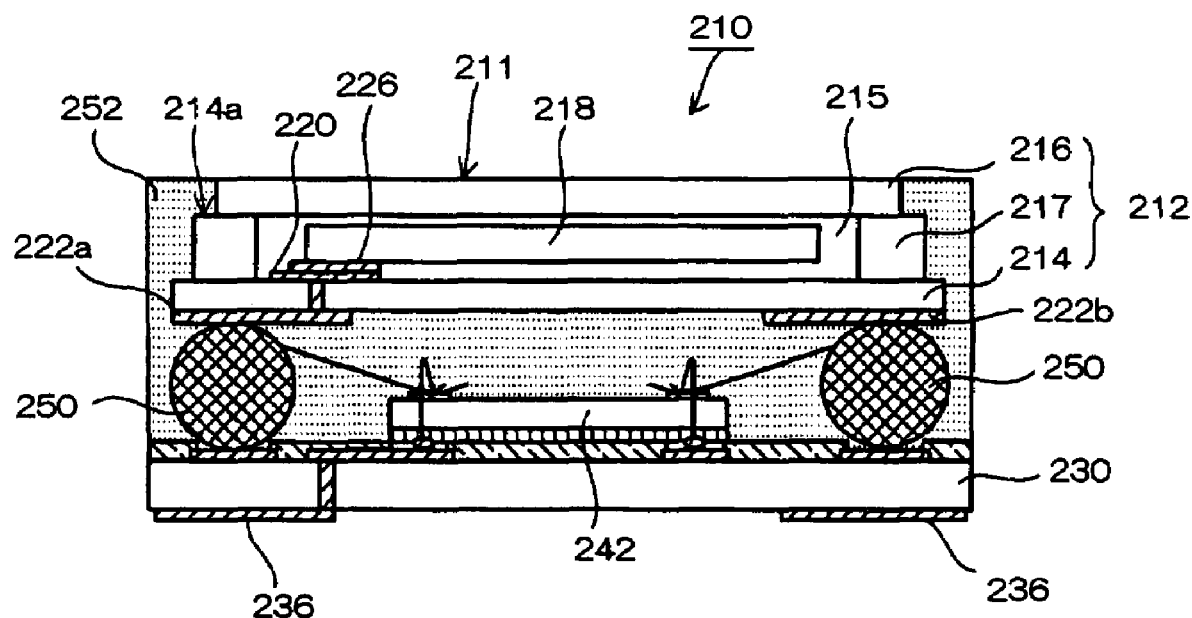
FIG. 12 shows a structure of a piezoelectric oscillator according to a third embodiment of the invention.

Next will be described a piezoelectric oscillator according to a third embodiment of the invention with reference to FIG. 12. The piezoelectric oscillator according to the second embodiment has almost the same structure as those of the piezoelectric oscillators 10 and 100 according to the first and the second embodiments described above. Thus, the same structural portions in FIG. 12 have reference numerals given by adding 200 to each reference numeral in FIG. 1 and thus detailed descriptions thereof are omitted.

The piezoelectric oscillator 210 according to the third embodiment is characterized by the structure of a piezoelectric resonator 211. Specifically, in the piezoelectric resonator used in each of the piezoelectric oscillators 10 and 110, the package is mainly comprised of the so-called box-shaped package base and the lid to accommodate the piezoelectric resonator element in the cavity formed in the package.

Meanwhile, in the piezoelectric resonator 211 used in the third embodiment, a package base 214 has a plate-shaped structure. On first and second surfaces of the plate are formed a mounting pad 220 and mounting external terminals 222a and 222b, respectively. Then, in order to form a cavity 215 for accommodating a piezoelectric resonator element 218, it is possible to use a thickness of a seam ring 217 for bonding the package base 214 to the lid 216. The seam ring is a conventionally used bonding member. Using the thickness of the seam ring 217 can ensure a sufficient space for accommodating the piezoelectric resonator element 218, which is among those that have recently been further miniaturized and made thinner.

Then, the planar package base 214 is bonded to the lid 216 by the seam ring 217. Meanwhile, in the piezoelectric resonators 11 and 111 of the piezoelectric oscillators 10 and 110 according to the first and the second embodiments, a seam ring (not shown in the drawings) is arranged on an upper-end opening portion of the box-type package base and the lid is disposed thereon to provide package sealing. As compared to the resonators 11 and 111, the piezoelectric resonator 211 can have a significantly reduced thickness. Accordingly, the piezoelectric oscillator 210 can be entirely small in height.

Additionally, in order to form the package base 214, it is unnecessary to use a substrate forming wall portions. Thus, it is also possible to improve productivity and achieve cost reduction.

Figure 13:
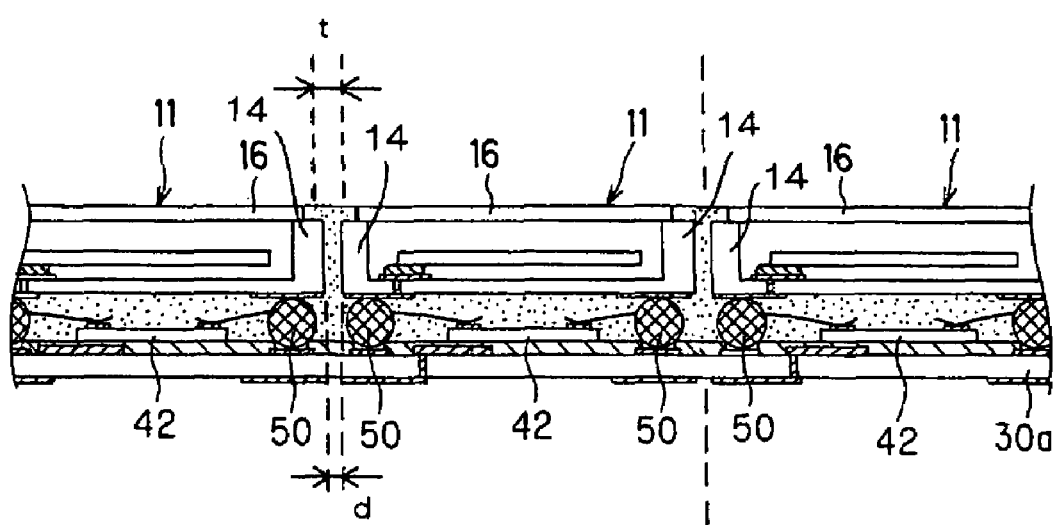
FIG. 13 shows an application example of the method for manufacturing the piezoelectric oscillator according to the first embodiment.

Furthermore, when manufacturing the piezoelectric oscillator according to each of the above embodiments, a form shown in FIG. 13 may be used (FIG. 13 illustrates the piezoelectric oscillator 10 according to the first embodiment, as an example). Specifically, when the IC 42 and the piezoelectric resonator 11 are arranged on the sheet-shaped substrate 30a, a distance d between adjacent piezoelectric resonators 11 is made smaller than a thickness t of a dicer blade (not shown in the drawing) when dicing is performed. Arranging the piezoelectric resonator 11 or the like on the sheet-shaped substrate 30a in the above form allows the outer edge of the package base 14 of the piezoelectric resonator 11 to be cut together at dicing. Consequently, a die size of the piezoelectric oscillator 10 cut as an individual device can be made smaller than that of the piezoelectric resonator 11 before dicing.

Additionally, an arrangement distance between the piezoelectric resonators 11 or the like on the sheet-shaped substrate 30a can be reduced. This allows an increase in the number of the piezoelectric resonator 11 or the like that can be arranged on the single sheet-shaped substrate 30a. As a result, the number of the piezoelectric oscillator 10 manufactured by using the single sheet-shaped substrate 30a can also be increased. Therefore, its productivity can be improved.

Figure 14:
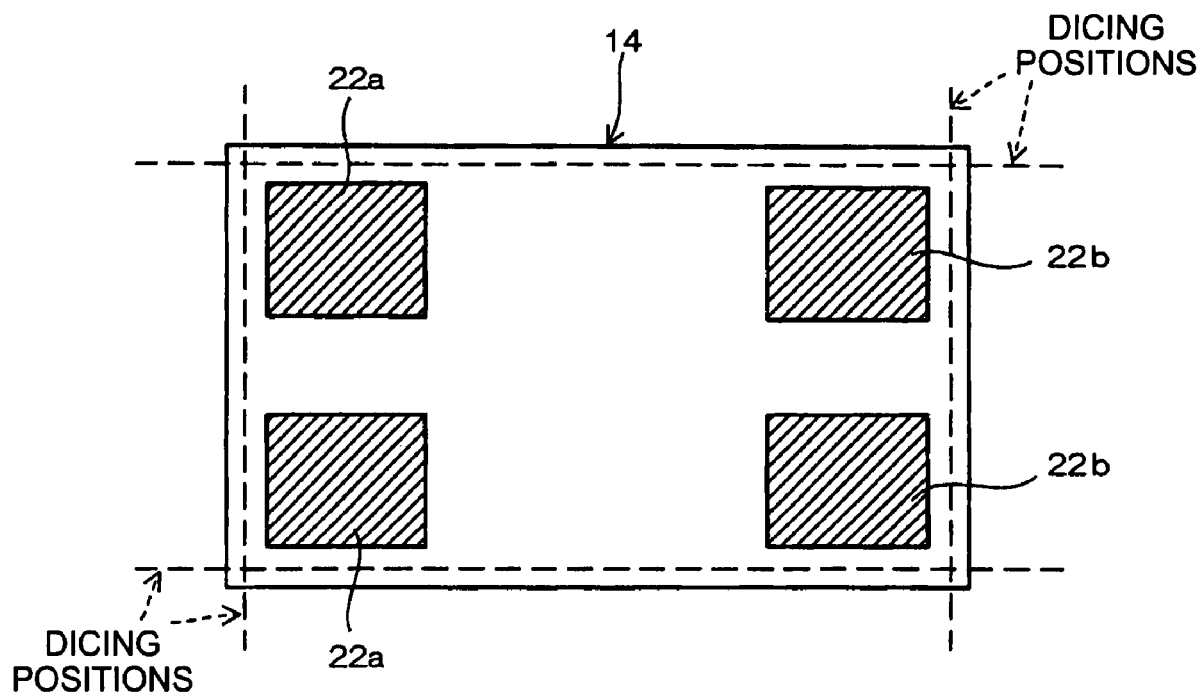
FIG. 14 shows an example of an arrangement form of a mounting external terminal in a piezoelectric resonator when implementing the application example.

In this manner, when cutting together the outer edge of the package base 14 at dicing, the mounting external terminals 22a and 22b on the bottom surface of the package base 14 is preferably arranged in a form as shown in FIG. 14. Specifically, a position for dicing by the dicer may be a position between the mounting external terminals 22 (22a and 22b) and the outer edge of the package base 14. Even after dicing, in order not to expose the mounting external terminals 22 on the side surfaces of the package base 12, those terminals are arranged on an inner peripheral side of the bottom surface thereof. Due to the structure, after formation of the molded portion 52, the mounting external terminals 22 are covered by a molding member (which forms the molded portion 52), so that they are not exposed to external air. Accordingly, no water vapor or the like adheres to the mounting external terminals 22. This can prevent a deviation of an oscillation frequency caused when an electrical resistance changes due to the adhesion of water vapor on the mounting external terminals 22.

Figure 15A:
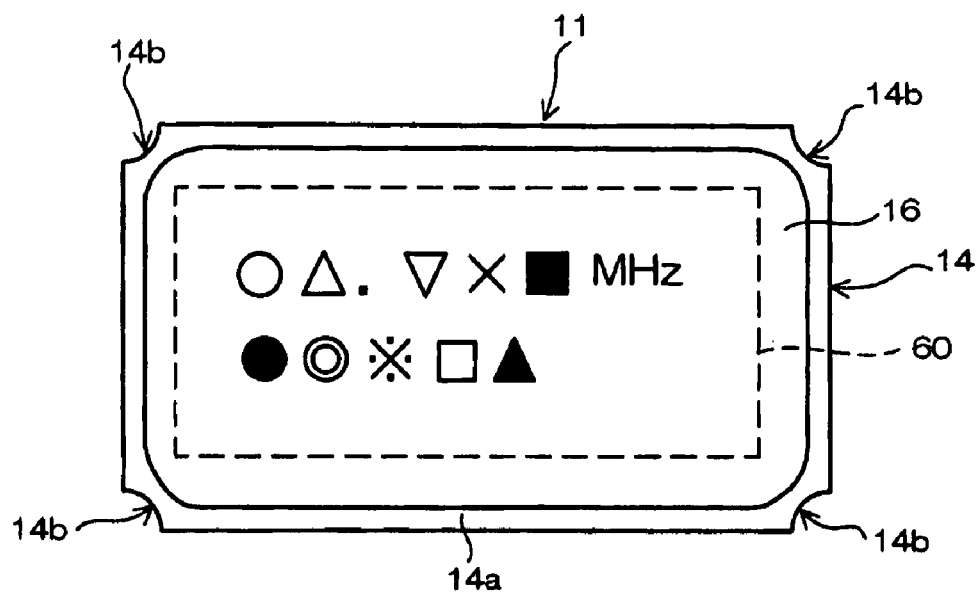
FIGS. 15A and 15B each show a package base having castellations and an example of the piezoelectric oscillator obtained by molding the package base in the first embodiment.
Figure 15B:
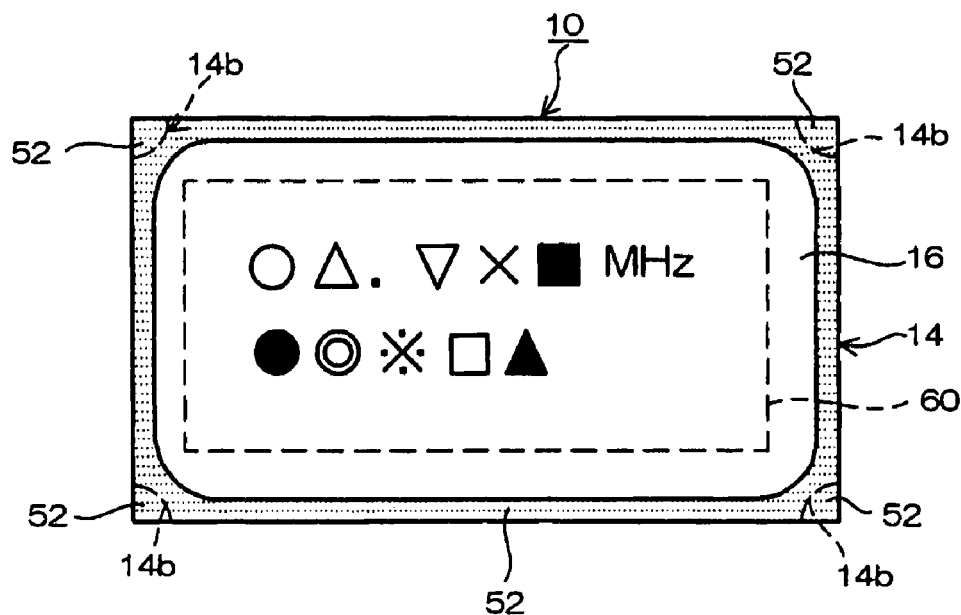

When cutting together the outer edge of the package base 14 at dicing, it is preferable to form a castellation 14*b* in the package base 14 or the like, as shown in FIGS. 15A and 15B. In this form, even after cutting together the outer edge thereof, the molded portion 52 can be left along the castellation 14*b*. This can maintain a condition in which the molded portion 52 formed on the upper end surface 14*a* of the package base 14 is physically connected to the molded portion 52 formed between the piezoelectric resonator 11 and the wiring substrate 30 (See FIG. 1). Therefore, it is possible to maintain a bonding strength between the piezoelectric resonator 11 and the connecting member 50.

Figure 16:
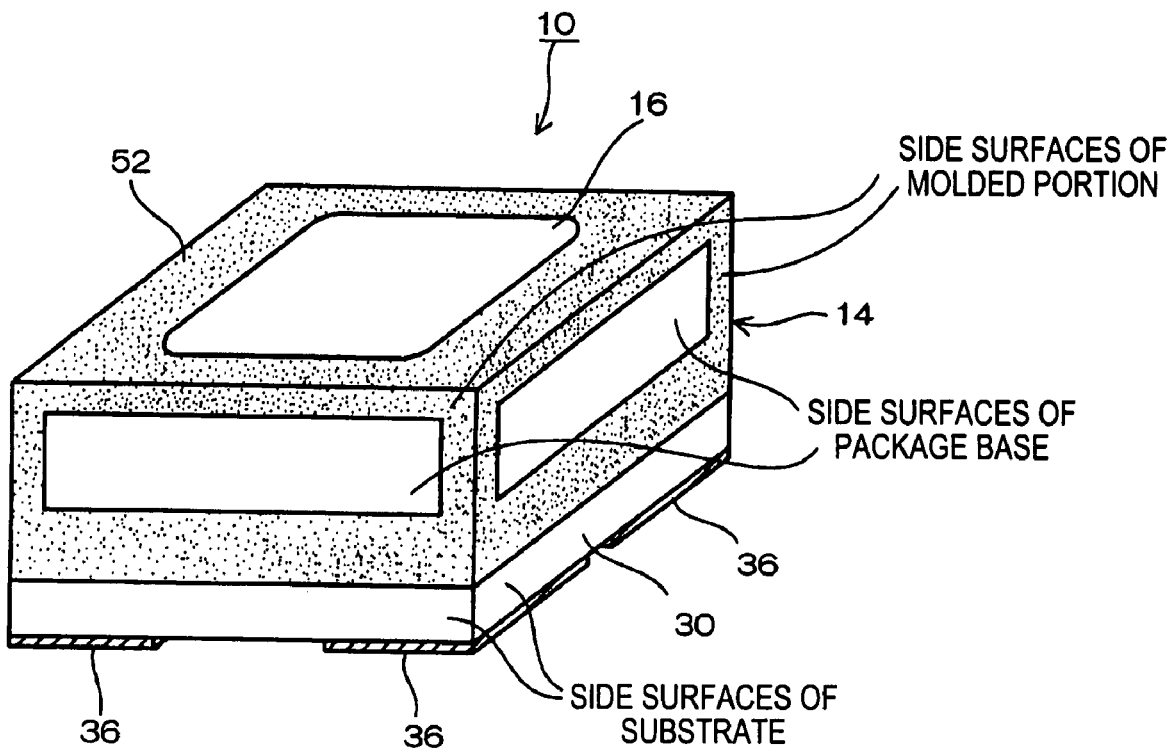
FIG. 16 shows a perspective view of a structure of the above piezoelectric oscillator including the piezoelectric resonator using the package base with the castellations, the oscillator being obtained by cutting together with an outer edge of the package base after molding.
Figure 17:
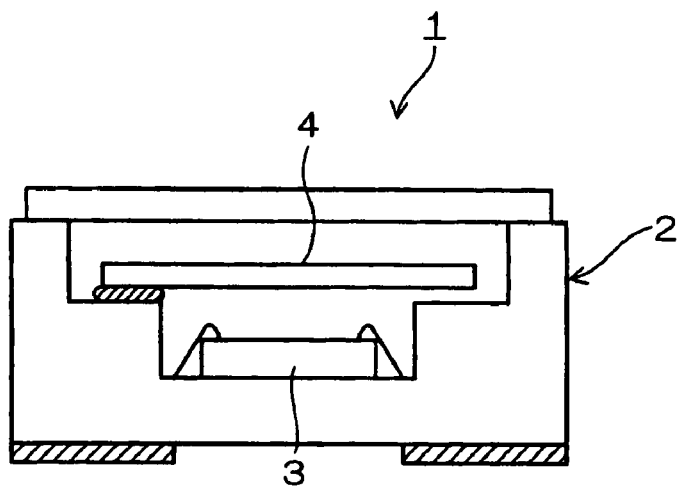
FIG. 17 shows a structure of a known piezoelectric oscillator.
Figure 18:
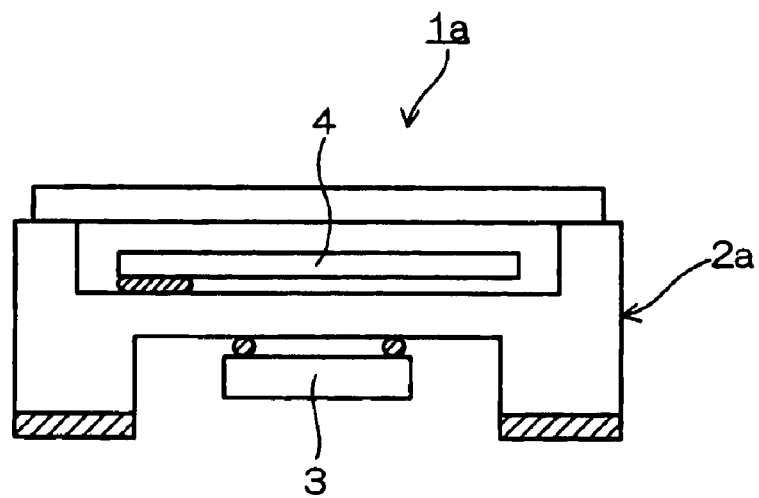
FIG. 18 shows a structure of another known piezoelectric oscillator.
Figure 19:
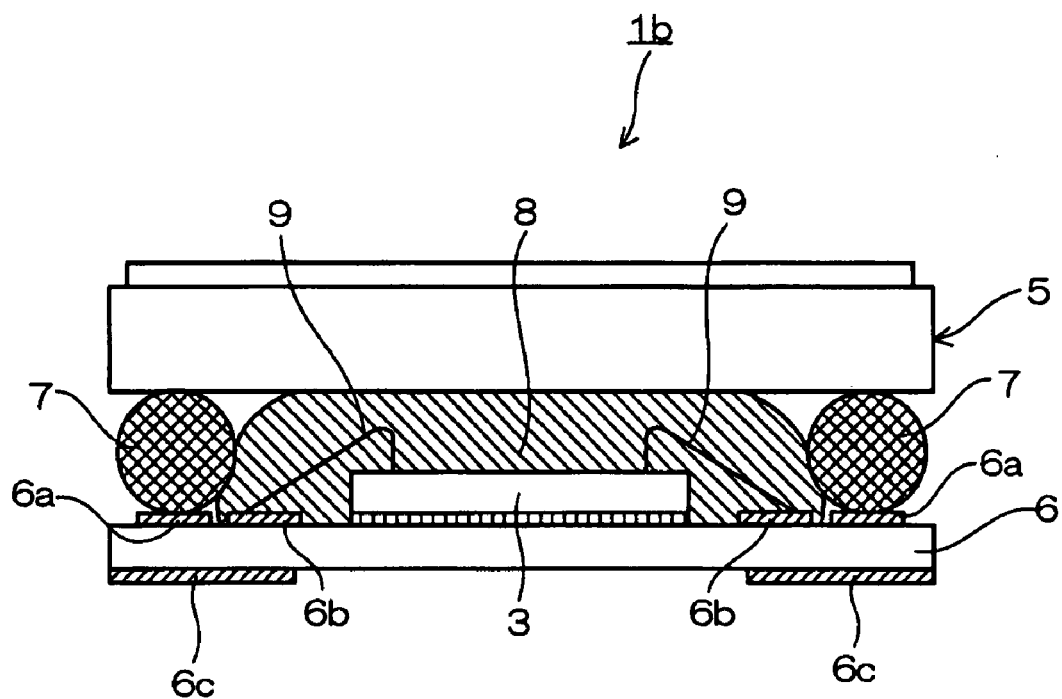
FIG. 19 shows a structure of another more recent known piezoelectric oscillator.

As described above, there is provided the piezoelectric resonator 11 using the package base 14 including the castellation 14*b*. The outer edge of the package base 14 is cut together with the molding member and the sheet-shaped substrate 30*a* (See FIG. 2). In this manner, as shown in FIG. 16, a side surface of the piezoelectric oscillator 10 includes side surfaces of the molded portion 52, of the package base 14 and of the wiring substrate 30. Therefore, as in the foregoing, even when the piezoelectric oscillator 10 is peripherally covered by the molding member, the die size thereof can be made equal to or smaller than that of the piezoelectric resonator 11 as one of the components included in the oscillator.

Although the invention has been described with reference to specific embodiments, it will be understood by those skilled in the art that various changes in form and detail may be made therein without departing from the spirit and scope of the invention disclosed and claimed therein.

The entire disclosure of Japanese Patent Application Nos. 2006-253004, filed Sep. 19, 2006 and 2007-185557, filed Jul. 17, 2007 are expressly incorporated by reference herein.

What is claimed is:

1. A piezoelectric device, comprising:
    a piezoelectric resonator including a piezoelectric resonator element, a package for accommodating the piezoelectric resonator in a cavity thereinside, a lid for airtightly sealing the cavity inside the package, a package base included in the package, and an external terminal formed on a bottom surface of the package base;
    a circuit element stacked together with the piezoelectric resonator to be electrically connected thereto;
    a wiring substrate having the circuit element mounted on a first surface thereof and a mounting external terminal provided on a second surface thereof;
    a connecting member arranged in a periphery of the circuit element mounted on the first surface of the wiring substrate to electrically and mechanically connect the wiring substrate to the external terminal of the piezoelectric resonator; and
    a molded portion made of a molding member that is formed from the first surface of the wiring substrate up to at least a position higher than an upper end surface of the package base of the piezoelectric resonator, the molded portion covering the first surface of the wiring substrate, the package base of the piezoelectric resonator, the external terminal formed on the bottom surface of the package base, the circuit element, and the connecting member, whereas at least a part of a marking region on the lid being exposed from the molded portion.

2. The piezoelectric device according to claim 1, wherein the connecting member includes two or more members having different melting points, the member with a higher melting point being a core whose outer periphery is covered by the member with a lower melting point and at least the latter member being a conductive member.

3. The piezoelectric device according to claim 1, wherein the circuit element is electrically connected to a mounting terminal arranged on the first surface of the wiring substrate by a metallic wire.

4. The piezoelectric device according to claim 1, wherein side surfaces of the molding member, of the package base and of the wiring substrate are positioned flush with one another to form a side surface of the piezoelectric device.

* * * * *